US011225730B2

(12) United States Patent
Jang et al.

(10) Patent No.: US 11,225,730 B2
(45) Date of Patent: Jan. 18, 2022

(54) METHOD FOR PRODUCING INGOT, RAW MATERIAL FOR INGOT GROWTH, AND METHOD FOR PREPARING THE RAW MATERIAL

(71) Applicant: SENIC INC., Seoul (KR)

(72) Inventors: Byung Kyu Jang, Suwon-si (KR); Jung-Gyu Kim, Suwon-si (KR); Jung Woo Choi, Suwon-si (KR); Sang Ki Ko, Suwon-si (KR); Kap-Ryeol Ku, Suwon-si (KR)

(73) Assignee: SENIC INC., Seoul (KR)

( * ) Notice: Subject to any disclaimer, the term of this patent is extended or adjusted under 35 U.S.C. 154(b) by 70 days.

(21) Appl. No.: 16/665,694

(22) Filed: Oct. 28, 2019

(65) Prior Publication Data

US 2020/0299859 A1 Sep. 24, 2020

(30) Foreign Application Priority Data

Mar. 21, 2019 (KR) .................. 10-2019-0032620

(51) Int. Cl.
| | | |
|---|---|---|
| *C30B 29/36* | (2006.01) | |
| *C30B 23/06* | (2006.01) | |
| *C01B 32/956* | (2017.01) | |

(52) U.S. Cl.
CPC .......... *C30B 23/066* (2013.01); *C01B 32/956* (2017.08); *C30B 29/36* (2013.01); *C01P 2004/02* (2013.01); *C01P 2004/61* (2013.01); *C01P 2006/11* (2013.01)

(58) Field of Classification Search
CPC ..... C30B 29/36; C30B 23/066; C01B 32/956; C01P 2004/02
See application file for complete search history.

(56) References Cited

U.S. PATENT DOCUMENTS

| | | | |
|---|---|---|---|
| 2014/0352607 A1 | 12/2014 | Kim et al. | |
| 2014/0367897 A1* | 12/2014 | Shin ....................... B82Y 30/00 | |
| | | | 264/682 |
| 2017/0335487 A1 | 11/2017 | Sasaki et al. | |

FOREIGN PATENT DOCUMENTS

| | | |
|---|---|---|
| CN | 103209923 A | 7/2015 |
| CN | 107208309 A | 9/2017 |
| JP | 2001-114599 A | 4/2001 |
| JP | 2002-293525 A | 10/2002 |
| JP | 2010-90012 A | 4/2010 |
| JP | 2010-100447 A | 5/2010 |
| JP | 2012-162452 A | 8/2012 |
| JP | 2012-171812 A | 9/2012 |
| JP | 2013-95632 A | 5/2013 |
| JP | 2015-151284 A | 8/2015 |
| JP | 2016-179920 A | 10/2016 |
| KR | 10-2013-0013703 A | 2/2013 |
| KR | 10-2013-0013710 A | 2/2013 |
| KR | 10-2013-0072067 A | 7/2013 |

(Continued)

*Primary Examiner* — Robert M Kunemund
(74) *Attorney, Agent, or Firm* — NSIP Law

(57) ABSTRACT

A method for producing an ingot includes loading a raw material comprising a raw material powder having a $D_{50}$ of 80 μm or more into a reactor (loading step), controlling the internal temperature of the reactor such that adjacent particles of the raw material powder are interconnected to form a necked raw material (necking step), and sublimating components of the raw material from the necked raw material to grow an ingot (ingot growth step).

20 Claims, 6 Drawing Sheets

(56) References Cited

FOREIGN PATENT DOCUMENTS

| | | |
|---|---|---|
| KR | 10-2015-0142246 A | 12/2015 |
| KR | 10-2016-0036527 A | 4/2016 |
| KR | 10-2017-0068333 A | 6/2017 |
| KR | 10-2017-0086982 A | 7/2017 |
| KR | 10-1819140 B1 | 1/2018 |
| KR | 10-1854731 B1 | 5/2018 |
| TW | I616401 B | 3/2018 |
| WO | WO 2013/015630 A2 | 1/2013 |

* cited by examiner

METHOD FOR PRODUCING INGOT, RAW MATERIAL FOR INGOT GROWTH, AND METHOD FOR PREPARING THE RAW MATERIAL

CROSS-REFERENCE TO RELATED APPLICATIONS

This application claims the benefit under 35 USC 119(a) of Korean Patent Application No. 10-2019-0032620 filed on Mar. 21, 2019, in the Korean Intellectual Property Office, the entire disclosure of which is incorporated herein by reference for all purposes.

BACKGROUND

1. Field

The present disclosure relates to a method for producing an ingot with few or substantially no defects through effective growth, a raw material for ingot growth, and a method for preparing the raw material.

2. Description of the Background

Single crystals of silicon carbide (SiC), silicon (Si), gallium nitride (GaN), sapphire ($Al_2O_3$), gallium arsenide (GaAs), aluminum nitride (AlN), etc. exhibit unexpected properties different from those of their polycrystals. Thus, there is an increasing demand for these single crystals in industrial fields.

Single-crystal silicon carbide (SiC) has a large energy band gap and its break field voltage and thermal conductivity are higher than those of silicon (Si). The carrier mobility of single-crystal silicon carbide is comparable to that of silicon, and the electron saturation drift velocity and breakdown voltage of single-crystal silicon carbide are also high. Due to these characteristics, single-crystal silicon carbide is expected to be applicable to semiconductor devices where high efficiency, high breakdown voltage, and large capacity are needed.

Many methods for producing single crystals are known. For example, Japanese Patent Publication No. 2001-114599 discloses a method for growing a single-crystal ingot on a seed crystal by heating with a heater in a vacuum container (furnace) into which argon gas can be introduced while maintaining the temperature of the seed crystal at a temperature lower by 10 to 100° C. than the temperature of a raw material powder.

Control over the characteristics of a raw material introduced into a furnace is required for the growth of a high-quality single-crystal ingot with few defects. However, the loading of a raw material in the form of a powder into a furnace may cause dust, leading to the formation of defects in an ingot. Korean Patent No. 10-1854731 discloses the use of a granulated agglomerative material after slurrying.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for producing an ingot includes loading a raw material having a raw material powder having a $D_{50}$ of 80 μm or more into a reactor (loading step), controlling the internal temperature of the reactor such that adjacent particles of the raw material powder are interconnected to form a necked raw material (necking step), and sublimating the raw material from the necked raw material to grow an ingot (ingot growth step).

When the inherent density of the raw material is defined as 100, the tap density of the raw material powder may be 69 or less.

The necking step may include raising temperature and subsequent heat treatment and the heat treatment may be performed at a temperature of 1,800° C. or more.

The necking step may be carried out at a pressure of 350 torr or more.

The raw material powder may have a tap density of 2.1 $g/cm^3$ or less.

The necked raw material may include a carbide layer on the surface.

The carbide layer may have a higher carbon content than the central portion of the particles of the raw material powder.

In the ingot growth step, the ingot may grow at a rate of 180 μm/hr or more.

The raw material powder may include SiC particles.

The ingot may be a SiC ingot.

In another general aspect, a raw material for ingot growth includes a raw material powder including particles having a $D_{50}$ of 80 μm or more, wherein the raw material powder includes a necked raw material in which at least portions of adjacent particles of the raw material powder are physically connected to one another.

When the inherent density of the raw material is defined as 100, the tap density of the necked raw material may be 69 or less.

The necked raw material may include a carbide layer on the surface.

The carbide layer may have a higher carbon content than the central portion of the particles of the raw material powder.

The particles of the raw material powder may be crystalline particles having an aspect ratio of 0.3 to 1.

The difference in the weight of the raw material for ingot growth before and after inhalation at an air flow of 20 $m^3$/min and a static pressure of 230 mmAq may be 2% by weight or less.

A method for preparing the raw material for ingot growth includes loading a raw material having a raw material powder having a $D_{50}$ of 80 μm or more into a reactor (loading step), and controlling the internal temperature of the reactor such that adjacent particles of the raw material powder are interconnected to form a necked raw material (necking step).

In another general aspect, a method for producing an ingot includes loading a raw material including a raw material powder having a $D_{50}$ of 80 μm or more into a reactor (loading step), wherein the raw material powder has a necked raw material in which portions of adjacent particles of the raw material powder are physically connected to one another; and sublimating the raw material from the necked raw material to grow an ingot (ingot growth step).

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
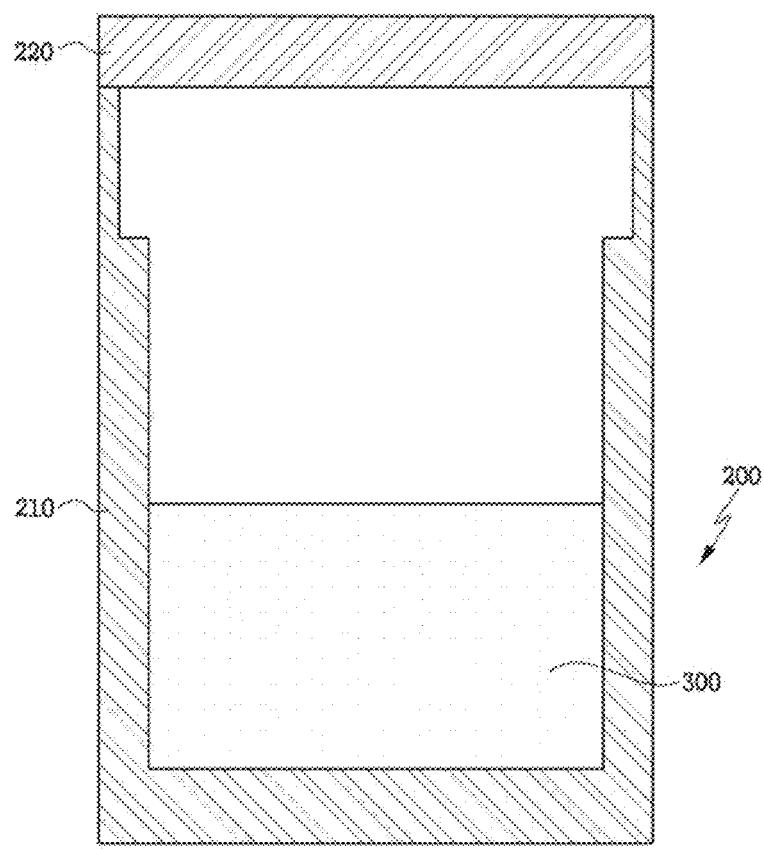
FIGS. 1 and 2 are conceptual views illustrating structures of crucibles as reactors for seed crystal growth according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

In the present specification, the term "combination of" included in Markush type description means mixture or combination of one or more elements described in Markush type and thereby means that the disclosure includes one or more elements selected from the Markush group.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

As used herein, the terms "about", "substantially", etc. are intended to allow some leeway in mathematical exactness to account for tolerances that are acceptable in the trade and to prevent any unconscientious violator from unduly taking advantage of the disclosure in which exact or absolute numerical values are given so as to help understand the application. Due to manufacturing techniques and/or tolerances, variations of the shapes shown in the drawings may occur. Thus, the examples described herein are not limited to the specific shapes shown in the drawings, but include changes in shape that occur during manufacturing.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

As used herein, the term "front surface" of a seed crystal generally refers to a wide, flat surface of the seed crystal on which a single-crystal ingot grows. As used herein, the term "rear surface" refers to a wide, flat surface of the seed crystal opposite to the front surface.

One or more examples of a method for producing an ingot with few or substantially no defects through effective growth, a raw material for ingot growth, and a method for preparing a raw material are described herein.

When a source powder with a small particle size is used to grow an ingot, channels through which a source (sublimated gas) of the source powder flows may be narrowed, with the result that the growth rate of an ingot may be lowered and polymorphs may be incorporated into the ingot, increasing the risk of defects in the production of the single-crystal ingot. When a source powder with a large particle size is used to grow an ingot, there is a risk that polymorphs may be incorporated into the grown ingot or poor crystallinity may be caused. A solution to these problems, according to one or more examples as disclosed herein, is that the use of necked raw material particles with a relatively large particle size can lead to relatively rapid growth of an ingot with few defects.

Figure 2:
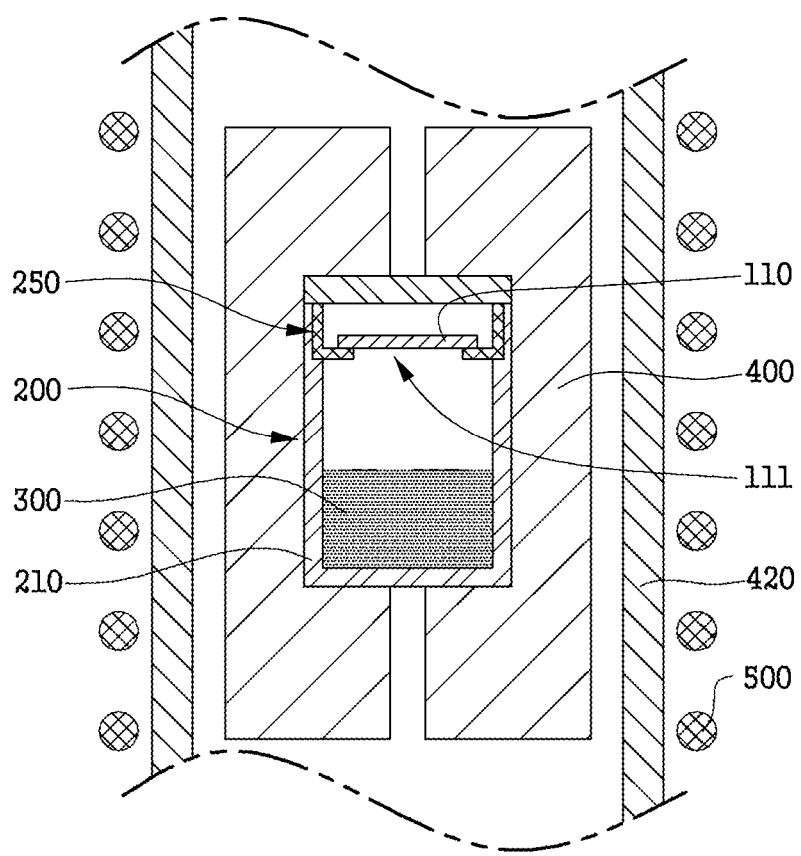

FIGS. 1 and 2 are conceptual views illustrating structures of crucibles as reactors for seed crystal growth according to one or more examples. The examples will now be described in more detail with reference to the accompanying drawings.

A method for producing an ingot according to one or more examples includes the steps of loading, necking, and ingot growth.

In the loading step, a raw material 300 comprising a raw material powder is loaded into a reactor 200.

The reactor 200 may be a container where a reaction for ingot growth occurs. For example, the reactor 200 may be a graphite crucible but is not limited thereto.

For example, the reactor 200 may include a body 210 having an internal space in which the raw material 300 is accommodated and an opening, and a cover 220 covering the opening of the body 210.

The reactor 200 may be surrounded and fixed by a heat insulating material 400 and may be set such that the heat insulating material 400 surrounding the reactor 200 is positioned in a reaction chamber 420 such as a quartz tube. The internal temperature of the reactor 200 may be controlled by heating means 500 surrounding the reaction chamber 420. For example, the heating means may be inductive, conductive, or radiative heater, electric heater, gas burner, laser heating, microwave heating, infrared heating, and the like, or a combination thereof.

The reactor 200 can be used to treat the raw material 300, which will be described below. The treatment of the raw material 300 and the growth of an ingot may take place in the same reactor 200 either continuously or stepwise.

In this case, a seed crystal 110 is set in the reactor 200.

For example, the seed crystal 110 for ingot growth may be attached to the cover 220. Alternatively, the seed crystal 110 may be arranged on the inner circumferential surface of the body 210 and may be supported by a stepped latching portion (not illustrated) in direct contact with the end portion of the seed crystal 110. Alternatively, a holder 250 may also be arranged in the reactor 200 to support the seed crystal 110.

The raw material may comprise a raw material powder having a $D_{50}$ of 80 μm or more. The raw material powder may have a $D_{50}$ of 100 μm or more or 120 μm or more. The raw material powder may have a $D_{50}$ of 400 μm or less or 300 μm or less.

The use of the raw material powder having the relatively large particle size described above enables the preparation of a necked raw material and the formation of relatively large spaces between particles of the necked raw material. The physical necking of the particles can minimize overall shrinkage or collapse of the necked raw material under high temperature and low pressure conditions even when a fluid flows through the spaces between the particles.

When the inherent density of the raw material is defined as 100, the tap density of the raw material powder may be 69 or less, from 40 to 69 or from 50 to 67. The use of the raw material powder whose tap density is low compared to the inherent density of the raw material ensures the formation of enough spaces between the particles, which assists in the flow of a sublimated source of the raw material powder.

The raw material powder may have a tap density of 2.37 g/cm$^3$ or less, 2.2 g/cm$^3$ or less or 1.7 to 2.1 g/cm$^3$. If the tap density of the raw material powder exceeds 2.37 g/cm$^3$, channels through which the raw material powder can flow after sublimation are not sufficiently formed, with the result that the degree of supersaturation at the seed crystal side may be lowered and the growth thickness of a final ingot may be insufficient. Another problem is that polycrystals may grow. That is, the use of the raw material powder having the tap density defined above enables relatively rapid growth of a single-crystal ingot with few defects.

The particles of the raw material powder may be crystalline particles. The crystalline particles may be relatively large in size and have similar shapes. For example, the particles of the raw material powder may have substantially the same size. For example, the particles of the raw material powder may be hexagonal crystalline particles.

The particles of the raw material powder may have an aspect ratio of 0.3 to 1 or 0.5 to 1. This aspect ratio facilitates the formation of enough spaces between the adjacent particles.

The ingot may be a SiC single-crystal ingot. In this case, the raw material powder may be a SiC powder. For example, the raw material may be amorphous SiC, alpha-SiC, beta-SiC or a mixture thereof. For example, the raw material powder may be a powder of alpha-SiC particles.

In the necking step, the internal temperature of the reactor 200 may be controlled such that adjacent particles of the raw material powder are interconnected to form a necked raw material 300. The particles of the raw material powder exist separately and independently from one another before necking. Thus, some of the particles tend to be scattered by a fluid flow, which may directly cause defects in a final ingot.

The individual particles are relatively easily displaceable by a fluid flow. The particles are made smaller in size during subsequent sublimation and close spaces present between other particles, resulting in narrowing of channels of a sublimated gas for ingot growth flows.

These problems are solved by using the necked raw material formed in the necking step. In the necked raw material, two or more adjacent particles share at least one point and are interconnected rather than exist as single particles.

The necking step is carried out such that the particles of the raw material powder are interconnected by necking.

The necking step may further include raising temperature and subsequent heat treatment. The necking step may further include cooling after the heat treatment.

In the necking step, impurities already present in the raw material or impurities incorporated during loading of the raw material into the reactor 200 are removed and necking between the raw material particles is induced.

The heat treatment may be performed at a temperature of 1,800° C. or more, a temperature of 2,000° C. or more, a temperature of 2,100 to 2,500° C. or a temperature of 2,000 to 2,4000° C. The heat treatment temperature allows for efficient necking between the raw material particles.

The heat treatment may be performed at a pressure of 350 torr or more, a pressure of 400 to 750 torr or a pressure of 500 to 700 torr. At this heat treatment pressure, efficient necking can be induced while suppressing sublimation of the raw material.

The heat treatment may be performed for 30 minutes or more, 40 minutes or more or 1 to 10 hours.

The heat treatment may be performed in an inert gas atmosphere, for example, a nitrogen ($N_2$) or argon (Ar) atmosphere. This heat treatment atmosphere can prevent the raw material from being depleted of carbon by heat treatment and enables stable production of a defect-free ingot as a result of carbonization of the powder surface.

The raising of the temperature is performed to raise the internal temperature of the reactor 200 to the heat treatment temperature. Raising the temperature can be performed such that the temperature is increased slowly over 3 to 5 hours.

The cooling is performed to reduce the internal temperature of the reactor 200 from the heat treatment temperature to room temperature. The cooling can be performed such that the temperature decreases slowly.

In the resulting necked raw material, two or more adjacent particles of the raw material powder are interconnected (necked).

For example, the adjacent particles of the necked raw material powder may have at least one interconnection point. For example, one particle of the raw material powder may be connected to two or more other particles of the raw material powder at two or more points. One particle of the raw material powder may also be connected to three or more other particles of the raw material powder at three or more points.

Two adjacent particles of the raw material powder exist connected to each other at one or more points and the relative positions of the particles are well maintained as a whole even after loading. In addition, the particles are structurally supported by one another after necking. Due to this structure, the individual particles are not easily scattered by a fluid flow in the reactor and spaces between the particles are kept unclosed even when the subsequent ingot growth step is carried out.

The necked raw material may include a carbide layer on the surface. The carbide layer has a higher carbon content than the central portion of the particles of the raw material powder. The higher carbon content of the carbide layer can be determined by X-ray photoelectron spectroscopy (XPS) or energy dispersive spectrometry (EDAX).

The interconnection of the particles of the raw material powder in the necked raw material and the formation of the carbide layer on the surface of the necked raw material can effectively prevent the powder from scattering during subsequent sublimation of the raw material. Carbon depletion during subsequent sublimation of the raw material powder (SiC) may result in the growth of undesired polymorphs. The carbon layer prevents carbon depletion, assisting in the stabilization of polymorphs in a final ingot.

Furthermore, the formation of the necked raw material in the necking step makes the carbon layer relatively uniform, which suppresses possible shrinkage of the powder in the subsequent ingot growth step to ensure enough channels through which a sublimated gas of the powder flows.

In the ingot growth step, the raw material is sublimated from the necked raw material to grow an ingot.

For example, sublimation and recrystallization of the raw material are induced under a low pressure and high temperature atmosphere to grow an ingot in the ingot growth step. The recrystallization may occur on the front surface 111 of the seed crystal.

The kind of the seed crystal may vary depending on the desired characteristics of the single-crystal ingot. For example, the seed crystal may be 4H—SiC, 6H—SiC, 3C—SiC, or 15R—SiC, but is not limited thereto.

The size of the seed crystal may vary depending on the desired characteristics of the ingot. For example, the ingot may have a diameter of 2 inches or more. For example, the ingot may have a diameter of 3 inches or more, 4 inches or more, 5 inches or more or 6 inches or more. For example, the ingot may have a diameter of 2 to 10 inches, 2 to 8 inches, 4 to 8 inches or 4 or 6 inches. The seed crystal may be suitably selected depending on the characteristics of the ingot.

In the ingot growth step, an ingot can be grown more rapidly when the necked raw material is used than when a powder having undergone no necking is used.

For example, in the ingot growth step, an ingot may be grown at a rate of 180 μm/hr or more, 200 μm/hr or more or 220 to 300 μm/hr. The ingot growth rate is at least about 1.5 times that obtained when a raw material powder having a tap density not higher than that described above is used. This high growth rate can reduce the number of defects in the ingot.

That is, the method according to the examples described herein enables vary rapid growth of an ingot with few defects.

The method of the examples disclosed herein will be described based on the growth of a silicon carbide ingot.

SiC in the form of a hexagonal crystalline powder ($D_{50}$=100-160 μm) may be loaded into a graphite crucible as the reactor 200. The SiC loaded into the reactor may be necked by heat treatment at a pressure of 750 torr and a temperature of 2,200 to 2,350° C. for at least 1 hour. A carbide layer may be formed on the surface of the necked raw material. The carbide layer may be black in color.

The necked raw material may be used to grow a 4H SiC ingot by a suitable method known in the art. The growth rate of the 4H SiC ingot may be from 220 to 280 μm/hr, which is much higher than that obtained when a SiC powder having a small particle size and a high tap density and having undergone no necking is used as a raw material.

A raw material for ingot growth according to a further example of the present disclosure may be a raw material powder including particles having a $D_{50}$ of 80 μm or more and including a necked raw material in which at least portions of adjacent particles of the raw material powder may be physically connected to one another.

The raw material, the raw material powder, etc. may be the same as those described above and a further detailed description thereof is omitted to avoid duplication.

A method for preparing the raw material for ingot growth according to another example of the present disclosure may include loading a raw material comprising a raw material powder having a $D_{50}$ of 80 μm or more into a reactor (loading step), and controlling the internal temperature of the reactor such that adjacent particles of the raw material powder may be interconnected to form a necked raw material (necking step).

The raw material for ingot growth may be the same as that described in the method for producing an ingot and a further detailed description is omitted to avoid duplication.

The present disclosure will be explained in more detail with reference to the following examples. However, these examples are merely illustrative to assist in understanding the present disclosure and are not intended to limit the scope of the present disclosure.

Necking of Silicon Carbide Source Powders

Example 1

A raw material was introduced into a graphite crucible 200, whose structure is schematically illustrated in FIG. 1. The raw material was a hexagonal crystalline SiC powder (purity 99.994%) having a $D_{50}$ of ≥120 μm.

The atmosphere of the crucible was adjusted to Ar or $N_2$. The internal pressure of the crucible was adjusted to 700 torr. The internal temperature of the crucible was slowly raised for 3 to 5 h. The raw material had heat treatment for necking at a temperature of 2300° C. for 5 h, and was cooled to prepare a necked raw material.

Example 2

A necked raw material was prepared in the same manner as in Example 1, except that the internal pressure of the crucible was changed to 600 torr.

Example 3

A necked raw material was prepared in the same manner as in Example 1, except that the heat treatment temperature was changed to 2250° C.

Comparative Example 1

A SiC powder prepared by the Acheson process ($D_{50}$=100-120 μm, purity=99.98%) was crushed and used as a raw material without heat treatment.

Evaluation of Physical Properties of the Raw Materials

1) Measurement of Tap Densities

The tap densities of the raw materials used in Examples 1-3 and Comparative Example 1 were measured using a densitometer (BeDensiT1, K-ONE NANO Ltd., Korea).

2) Measurement of Particle Sizes

The particle sizes of the raw materials used in Examples 1-3 and Comparative Example 1 were measured using a particle size analyzer (S3500, MICROTRAC) based on dry analysis.

3) Observation of Powder Shapes

Figure 3:
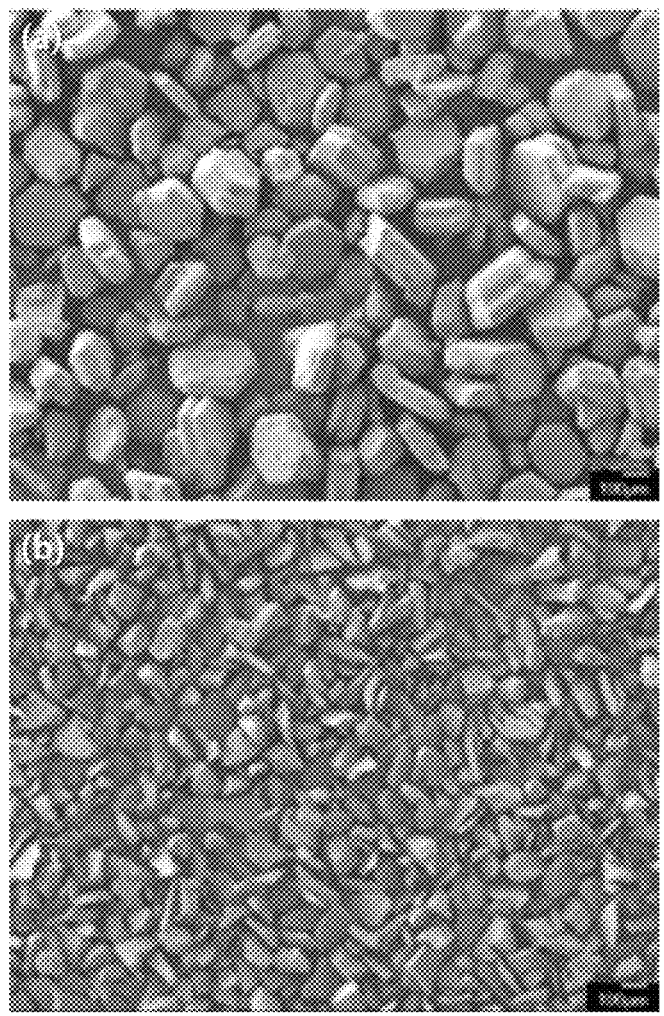
FIG. 3 shows microscopy images of raw materials used in (a) Examples 1-3 and (b) Comparative Example 1.

The powder shapes of the raw materials used in Examples 1-3 and Comparative Example 1 were observed with a scanning electron microscope (SEM). The images are shown in FIG. 3 ((a): the raw materials used in Examples 1-3, (b): the raw material used in Comparative Example 1, scale bar=100 μm).

4) Surface Observation of the Necked Raw Materials

Figure 4:
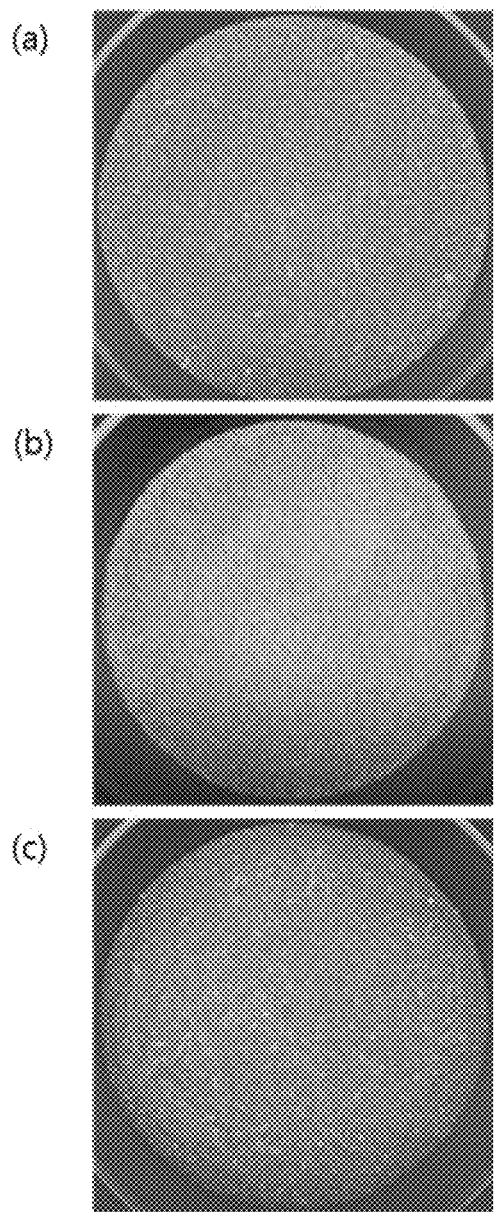
FIG. 4 shows images of necked raw materials prepared by heat treatment in (a) Example 1, (b) Example 2, and (c) Example 3, which were taken after crucibles were uncovered.

After completion of the heat treatment in Examples 1-3, the lids were removed from the crucibles and the surfaces of the necked raw materials were observed. The images are shown in FIG. 4.

5) Observation of Degrees of Necking of the Necked Raw Materials (Rod Evaluation)

Figure 5:
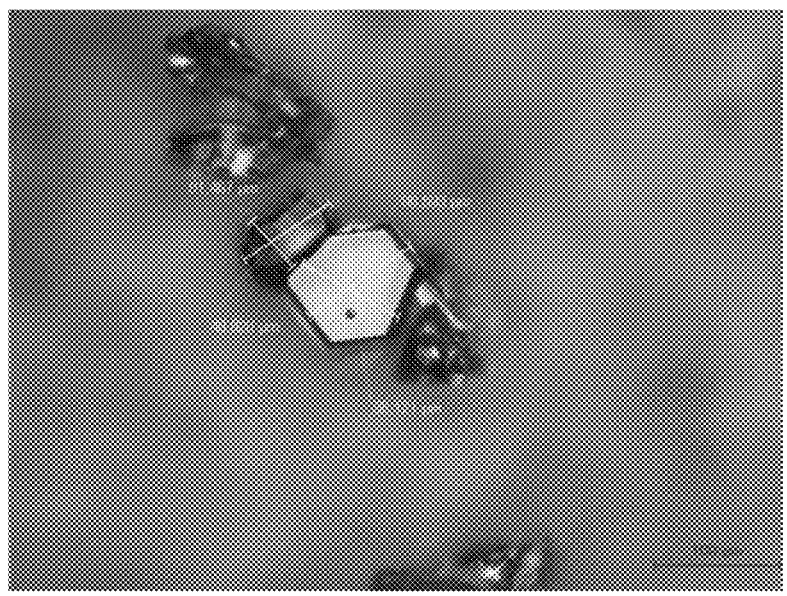
FIG. 5 is an image of a necked raw material prepared by heat treatment in one of Examples 1 to 3.

A portion of each of the necked raw materials after the heat treatment was separated and the interconnected particles were observed with a microscope. The image is shown in FIG. 5. The image reveals that the particles had different sizes and were interconnected by necking.

After an elongated rod pierced into at least four portions of each of the necked raw materials, including portions of the raw material in direct contact with the center and the wall surface of the crucible, the penetration depths of the rod were measured. The degree of necking of the necked raw material was evaluated based on the following criteria: "×" when the rod penetrated to a depth of 3 mm in two or more portions, "Δ" when the rod penetrated to a depth of ≥2 mm in one or more portions, and "○" when the rod penetrated to a depth of <2 mm in all portions. The results are shown in Table 1.

6) Observation as to Whether Enough Channels were Formed (Inhalation Evaluation)

After the heat treatment, each of the necked raw material powders was inhaled. A variation in the weight of the necked raw material powder before and after the inhalation was measured. The necked raw material was evaluated to have enough channels ("○") when the variation was ≤2 wt % and to have insufficient channels ("Δ") when the variation was >2 wt %. For the powder inhalation, the inlet of a dust collector operated at an air flow of 20 $m^3$/min and a static pressure of 230 mmAq was directly connected to the entrance of the crucible.

TABLE 1

| | Example 1 | Example 2 | Example 3 | Comparative Example 1 |
|---|---|---|---|---|
| Powder shape | Hexagonal crystalline | Hexagonal crystalline | Hexagonal crystalline | Crushed |
| Tap density (g/$cm^3$) | 2.04 | 2.07 | 2.04 | 2.38 |
| Particle size $D_{50}$, μm | 131 | 131 | 131 | 116.7 |
| Particle size $D_{10}$, μm | 241 | 241 | 241 | 65.1 |
| Particle size $D_{90}$, μm | 315 | 315 | 315 | 181.6 |
| Heat treatment temperature, ° C. | 2300 | 2300 | 2250 | Untreated |
| Pressure, torr | 700 | 600 | 700 | Untreated |
| Degree of necking (rod evaluation) | ○ | ○ | ○ | — |
| Determination of whether enough channels were formed (inhalation evaluation) | ○ | ○ | ○ | — |

※ For Comparative Example 1, since heat treatment was not performed, there were no data on the evaluation of degree of necking & determination of whether enough channels were formed.

Referring to Table 1 and FIGS. 3 and 4, the hexagonal crystalline forms of the powders used in Examples 1-3 were clearly observed, unlike the crushed form of the powder used in Comparative Example 1. The particle sizes of the powders used in Examples 1-3 were large and uniform (see FIG. 3). The colors of the necked raw materials were slightly different depending on the necking temperature. The necked raw material prepared in Example 1 was the darkest in color, demonstrating that a carbide layer on the surface was best formed (see FIG. 4).

The raw materials used in Examples 1-3 had low tap densities of <2.1 g/$cm^3$. The degrees of necking of the necked raw materials prepared in Examples 1-3 were sufficiently high, as evaluated using a rod. In addition, the necked raw materials prepared in Examples 1-3 were found to have enough channels.

Production of Silicon Carbide Ingots

As schematically shown in FIG. 2, each of the necked raw materials prepared in Examples 1-3 and Comparative Example 1 was loaded into the crucible body 210. The seed crystal 110 was held on the crucible body. Here, the rear surface of the seed crystal (the surface with a protective film) was directed toward the top of the crucible and the growth surface of the seed crystal (the surface without a protective film) was directed toward the bottom of the crucible.

The crucible body 210 provided with the seed crystal 110 and the holder 250 was covered with the cover 220, surrounded by the heat insulating material 400, and put into the reaction chamber 420 provided with a heating coil as the heating means 500 (see FIG. 2). The crucible was evacuated, argon gas was slowly introduced into the crucible until the internal pressure of the crucible 200 reached atmospheric pressure, and the internal pressure of the crucible 200 was slowly reduced again. Simultaneously with the pressure reduction, the internal temperature of the crucible 200 was slowly raised to 2300° C.

A SiC single-crystal ingot was grown on the protective film-free surface of the seed crystal at a temperature of 2300° C. and a pressure of 20 torr for 100 h.

Figure 6:
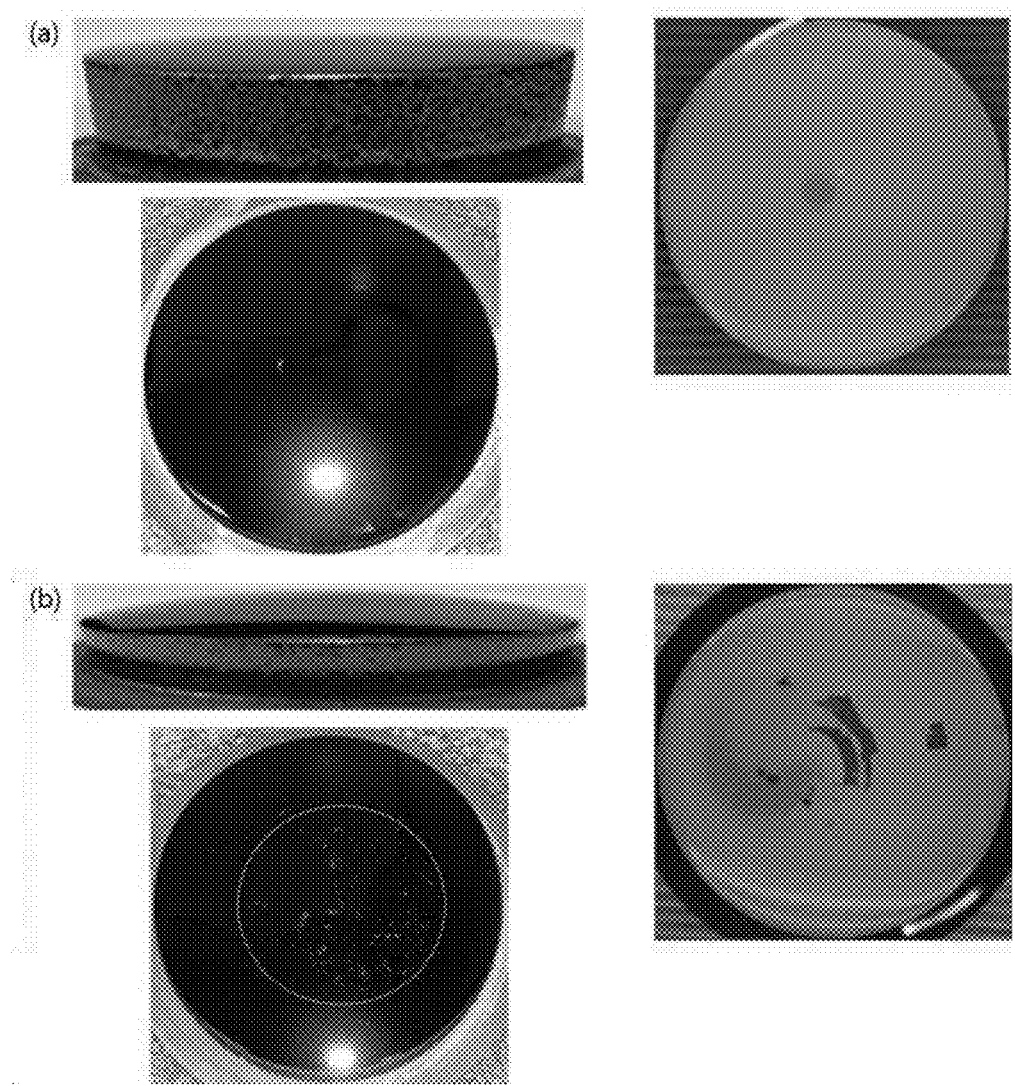
FIG. 6 shows actual images of (a) ingots grown from necked raw materials prepared in Example 1 and (b) an ingot grown from a raw material prepared in Comparative Example 1.

Images of the silicon carbide ingots grown in Example 1 and Comparative Example 1 are shown in FIG. 6. The relevant characteristics (including growth rates) of the ingots are shown in Table 2.

The characteristics were evaluated as follows:

Determination of whether pits or clusters as defects were formed: The formation of pits or clusters in the grown ingots was observed with naked eyes or under an optical microscope.

Determination of whether polymorphs were incorporated: The incorporation of polymorphs in the grown ingots was observed by UV-induced luminescence imaging.

TABLE 2

|  | Example 1 | Example 2 | Example 3 | Comparative Example 1 |
|---|---|---|---|---|
| Ingot growth rate (μm/hr) | 250 | 240 | 150 | 130 |
| Formation of pits/clusters | Not observed | Not observed | Not observed | Observed |
| Incorporation of polymorphs | Not observed | Not observed | Not observed | Observed |

The images of FIG. 6 reveal that the heights of the grown ingots were very different despite the same growth time. The growth rates of the ingot from the necked raw material prepared in Example 1 and the ingot from the raw material prepared in Comparative Example 1 were 250 μm/hr and 130 μm/hr, respectively. Pits were formed in the ingot grown from the raw material prepared in Comparative Example 1, as indicated by white dots in FIG. 6. In contrast, the 4H SiC single-crystal ingot grown from the necked raw material prepared in Example 1 was well formed without polymorph incorporation or pit formation.

One or more examples of a method for producing an ingot as described herein enables the production of a high-quality ingot without substantial powder scattering. The raw material for ingot growth according to the examples described herein can be used to produce a single-crystal ingot at a high growth rate. The method for preparing the raw material according to the examples described herein provides channels through which a sublimated gas of the raw material can flow and that are unlikely to collapse upon subsequent sublimation.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for producing an ingot, comprising:
loading a raw material comprising a raw material powder comprising a $D_{50}$ of 80 μm or more into a reactor;
controlling an internal temperature of the reactor such that adjacent particles of the raw material powder are interconnected to form a necked raw material; and
sublimating the raw material from the necked raw material to grow an ingot,
wherein the necked raw material comprises a carbide layer on a surface thereof, wherein the carbide layer comprises a higher carbon content than a central portion of particles of the raw material powder.

2. The method according to claim 1, wherein when an inherent density of the raw material is defined as 100, a tap density of the raw material powder is 69 or less.

3. The method according to claim 1, wherein the controlling the internal temperature of the reactor comprises raising temperature and a subsequent heat treatment, and the subsequent heat treatment is performed at a temperature of 1,800° C. or more.

4. The method according to claim 1, wherein the controlling the internal temperature of the reactor is carried out at a pressure of 350 torr or more.

5. The method according to claim 1, wherein a tap density of the raw material powder is 2.1 g/cm$^3$ or less.

6. The method according to claim 1, wherein, in the sublimating the raw material, the ingot grows at a rate of 180 μm/hr or more.

7. The method according to claim 1, wherein the raw material powder comprises SiC particles.

8. The method according to claim 1, wherein the ingot is a SiC ingot.

9. A raw material for ingot growth comprising a raw material powder comprising particles comprising a $D_{50}$ of 80 μm or more, wherein the raw material powder comprises a necked raw material in which at least portions of adjacent particles of the raw material powder are physically connected to one another, wherein particles of the raw material powder are crystalline particles having an aspect ratio of 0.3 to 1.

10. The raw material for ingot growth according to claim 9, wherein when an inherent density of the raw material is defined as 100, a tap density of the necked raw material is 69 or less.

11. The raw material for ingot growth according to claim 9, wherein the necked raw material comprises a carbide layer on a surface thereof, wherein the carbide layer comprises a higher carbon content than a central portion of the particles of the raw material powder.

12. The raw material for ingot growth according to claim 9, wherein a difference in a weight of the raw material for ingot growth before and after inhalation at an air flow of 20 m³/min and a static pressure of 230 mmAq is 2% by weight or less.

13. A method for preparing the raw material for ingot growth according to claim 9, comprising: loading a raw material comprising a raw material powder having a $D_{50}$ of 80 μm or more into a reactor; and controlling an internal temperature of the reactor such that adjacent particles of the raw material powder are interconnected to form a necked raw material.

14. A method for producing an ingot, comprising:
    loading a raw material comprising a raw material powder comprising a $D_{50}$ of 80 μm or more into a reactor, wherein the raw material powder comprises a necked raw material in which portions of adjacent particles of the raw material powder are physically connected to one another; and
    sublimating the raw material from the necked raw material to grow an ingot,
    wherein a difference in a weight of the raw material before and after inhalation at an air flow of 20 m³/min and a static pressure of 230 mmAq is 2% by weight or less.

15. The method according to claim 14, wherein when an inherent density of the raw material is defined as 100, and a tap density of the raw material powder is 69 or less.

16. The method according to claim 14, wherein the necked raw material is prepared by raising temperature and subsequent heat treatment, and the subsequent heat treatment is performed at a temperature of 1,800° C. or more.

17. The method according to claim 14, wherein the necked raw material is prepared at a pressure of 350 torr or more.

18. The method according to claim 14, wherein a tap density of the raw material powder is 2.1 g/cm³ or less.

19. The method according to claim 14, wherein, in the sublimating the raw material, the ingot grows at a rate of 180 μm/hr or more.

20. The method according to claim 14, wherein the raw material powder comprises SiC particles.

\* \* \* \* \*